(12) United States Patent
Kimata et al.

(10) Patent No.: US 9,655,270 B2
(45) Date of Patent: May 16, 2017

(54) ELECTRONIC DEVICE AND ELECTROMAGNETIC NOISE CONTROL METHOD

(71) Applicant: Mitsubishi Electric Corporation, Chiyoda-ku, Tokyo (JP)

(72) Inventors: Hiroyuki Kimata, Tokyo (JP); Satoru Ishizaka, Tokyo (JP); Toshio Anzai, Tokyo (JP); Keita Fujimaru, Tokyo (JP); Yoko Toda, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 14/436,665

(22) PCT Filed: Oct. 22, 2012

(86) PCT No.: PCT/JP2012/077198
§ 371 (c)(1),
(2) Date: Apr. 17, 2015

(87) PCT Pub. No.: WO2014/064745
PCT Pub. Date: May 1, 2014

(65) Prior Publication Data
US 2015/0342078 A1    Nov. 26, 2015

(51) Int. Cl.
*H05K 7/14* (2006.01)
*H05K 7/18* (2006.01)
(Continued)

(52) U.S. Cl.
CPC ............ *H05K 7/1427* (2013.01); *H05K 3/22* (2013.01); *H05K 9/0062* (2013.01); *H05K 9/0064* (2013.01); *Y10T 29/49126* (2015.01)

(58) Field of Classification Search
CPC ...... H05K 7/1427; H05K 3/22; H05K 9/0062; H05K 9/0064; Y10T 29/49126
(Continued)

(56) References Cited

U.S. PATENT DOCUMENTS 4,642,727 A * 2/1987 Dalal .................... H05K 9/0067
361/212
5,187,648 A * 2/1993 Ito ......................... H05K 7/1418
211/41.17
(Continued)

FOREIGN PATENT DOCUMENTS

JP      2-27799 U      2/1990
JP      11-031891 A    2/1999
(Continued)

OTHER PUBLICATIONS

International Search Report (PCT/ISA/210) mailed on Jan. 22, 2013, by the Japanese Patent Office as the International Searching Authority for International Application No. PCT/JP2012/077198.
(Continued)

*Primary Examiner* — Hung S Bui
(74) *Attorney, Agent, or Firm* — Buchanan Ingersoll & Rooney PC (57) ABSTRACT

An electronic device comprises a plurality of printed circuit boards having signal GNDs, a metal bar which electrically connects to the respective signal GNDs of the plurality of printed circuit boards, and a card basket which houses the plurality of printed circuit boards and the metal bar and serves as a frame GND. The electronic device also comprises a dielectric between the card basket and the metal bar. The metal bar, the card basket, and the dielectric constitute a noise control capacitor having specific frequency characteristics. By the specific frequency characteristics, the noise control capacitor releases electromagnetic noise occurring in
(Continued)

the respective signal GNDs to an outside and shields external noise generated outside.

11 Claims, 7 Drawing Sheets

(51) Int. Cl.
*H05K 3/22* (2006.01)
*H05K 9/00* (2006.01)

(58) Field of Classification Search
USPC ....... 361/799, 816, 818, 727, 752, 756, 796, 361/800
See application file for complete search history.

(56) References Cited

U.S. PATENT DOCUMENTS

| | | | | |
|---|---|---|---|---|
| 5,708,552 | A * | 1/1998 | Han | H05K 9/0016 361/220 |
| 7,013,088 | B1 * | 3/2006 | Jiang | G02B 6/4204 385/88 |
| 7,320,615 | B2 * | 1/2008 | Fang | H05K 7/1418 439/377 |

FOREIGN PATENT DOCUMENTS

| | | |
|---|---|---|
| JP | 2000-244168 A | 9/2000 |
| JP | 2002-261410 A | 9/2002 |
| JP | 2003-060325 A | 2/2003 |
| JP | 2005-167314 A | 6/2005 |
| JP | 2006-325301 A | 11/2006 |
| JP | 2008-251807 A | 10/2008 |
| JP | 2009-146962 A | 7/2009 |

OTHER PUBLICATIONS

Office Action (Notification of Reason of Rejection) issued on Jun. 2, 2015, by the Japanese Patent Office in corresponding Japanese Patent Application No. 2014-543013, and a Partial English Translation of the Office Action. (5 pages).

Translation of Written Opinion of the International Searching Authority (Form PCT/ISA/237) issued on Apr. 22, 2015 by WIPO in corresponding International Application No. PCT/JP2012/077198.(5 pages).

Extended European Search Report dated May 30, 2016, issued in corresponding European Patent Appln. No. 12886954.2 (7 pages).

* cited by examiner

ELECTRONIC DEVICE AND ELECTROMAGNETIC NOISE CONTROL METHOD

TECHNICAL FIELD

The present invention relates, for example, to an electronic device free from the influence of electromagnetic noise, and an electromagnetic noise control method.

BACKGROUND ART

Conventionally, a plurality of printed circuit boards are arranged in parallel on a substrate called a backboard, and an electronic device accommodating such a structure in a card basket is used.

The backboard is provided with a plurality of connectors to connect to the printed circuit boards, and is electrically connected to the circuit patterns (power supply, signal, ground, and the like) of the printed circuit boards via the connector pins of the respective connectors.

The signal GNDs (SG: signal ground) of the plurality of printed circuit boards are electrically connected via the connector pins of the respective connectors of the backboard. Thus, a potential difference occurs among the signal GNDs of the printed circuit boards due to the impedance of the connector pins, making unstable the circuit operations of the printed circuit boards.

Furthermore, in order to avoid electromagnetic noise (for example, lightning surge) occurring outside the electronic device from flowing to the signal GND of the printed circuit board, the signal GND of each printed circuit board is insulated from the card basket that serves as a frame GND (FG: frame ground). Therefore, if electromagnetic noise occurs in the signal GND of the printed circuit board, the electromagnetic noise cannot be released to the outside of the electronic device, making unstable the circuit operation of the printed circuit board.

CITATION LIST

Patent Literature

Patent Literature 1: JP 2003-060325
Patent Literature 2: JP 2008-251807
Patent Literature 3: JP 2006-325301

SUMMARY OF INVENTION

Technical Problem

It is an object of the present invention to release the electromagnetic noise occurring in the signal GND of the printed circuit board to the outside and to enhance the durability of the printed circuit board against electromagnetic noise occurring outside.

Solution to Problem

An electronic device according to the present invention includes:
a plurality of circuit boards having signal grounds;
a conductive plate electrically connected to the signal grounds of the plurality of circuit boards;
a board housing frame that houses the plurality of circuit boards and the conductive plate and has a frame surface serving as a frame ground; and
a dielectric provided between the frame surface of the board housing frame and the conductive plate.

Advantageous Effects of Invention

According to the present invention, the electromagnetic noise occurring in the signal GND (signal ground) of the printed circuit board can be released to the outside, and the durability of the printed circuit board against electromagnetic noise occurring outside can be enhanced.

DESCRIPTION OF EMBODIMENTS

Embodiment 1

An embodiment will be described in which electromagnetic noise occurring in the signal GND (SG: signal ground) of a printed circuit board is released to the outside and the durability of the printed circuit board against electromagnetic noise occurring outside is enhanced.

Figure 1:
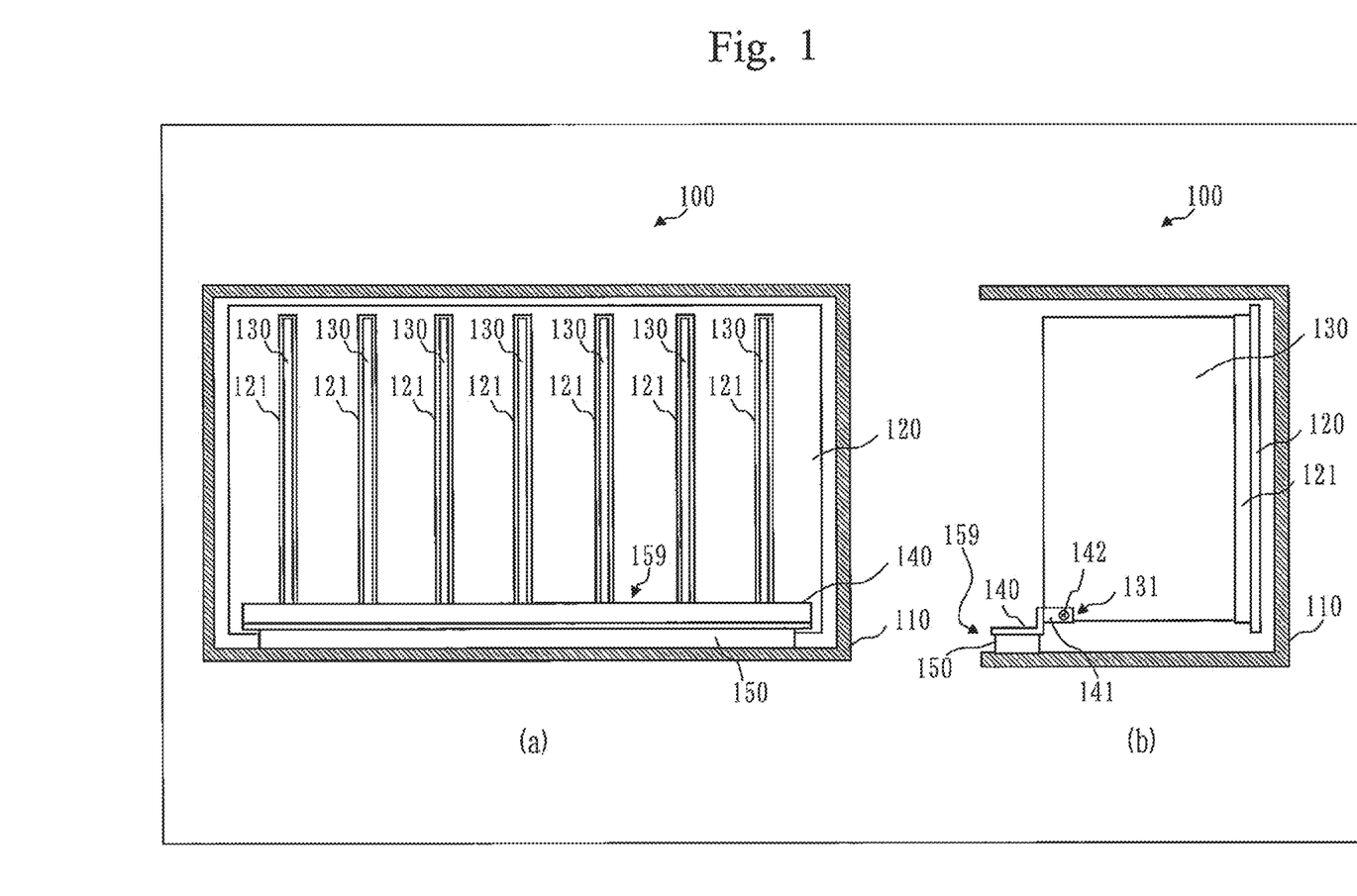
FIG. 1 illustrates the internal structure of an electronic device 100 according to Embodiment 1.

FIG. 1 illustrates the internal structure of an electronic device 100 according to Embodiment 1. In FIG. 1, (a) is a front view, and (b) is a side sectional view.

The electronic device 100 according to Embodiment 1 will be described with reference to FIG. 1.

The electronic device 100 is provided with a card basket 110 which houses a plurality of printed circuit boards 130 arranged in parallel.

The card basket 110 (an example of a board housing frame) is a container for housing the plurality of printed circuit boards 130, a backboard 120 to which the plurality of printed circuit boards 130 arranged in parallel are connected, a metal bar 140 connected to respective signal GNDs 131 of the plurality of printed circuit boards 130, and a dielectric 150.

The card basket 110 is formed of a metal plate or has a metal surface and serves as a protection case which protects the plurality of printed circuit boards 130 that are housed. The card basket 110 also serves as a frame GND (FG: frame ground) to be grounded.

The backboard 120 is a printed circuit board to which the plurality of printed circuit boards 130 arranged in parallel are connected. The backboard 120 is also called a back plane, a main board, and the like. For example, the mother board of a computer is an example of the backboard 120.

The backboard 120 has a plurality of connectors 121 arranged in parallel.

The plurality of printed circuit boards 130 are fitted in and connected to the corresponding connectors 121 so that the plurality of printed circuit boards 130 are arranged in parallel.

The printed circuit board 130 (an example of a circuit board) is a circuit board having a circuit pattern (also called a wiring pattern) that forms an electronic circuit. The circuit pattern will not be illustrated (throughout the drawings).

The printed circuit board 130 has the signal GND 131 that determines the reference potential of the electronic circuit.

The signal GND 131 is that portion of the circuit pattern which determines the reference potential of the electronic circuit.

A screw hole is formed in the signal GND 131 for connecting the metal bar 140 to the signal GND 131.

The metal bar 140 (an example of a conductive plate) is a plate-like member to electrically connect to the respective signal GNDs 131 of the plurality of printed circuit boards 130.

The metal bar 140 is provided with a plurality of connecting portions 141 to connect to the respective signal GNDs 131 of the plurality of printed circuit boards 130. Each connecting portion 141 has a screw hole where a screw 142 is to be inserted.

By screwing the connecting portions 141 to the signal GNDs 131 of the corresponding printed circuit boards 130, the metal bar 140 is fixed to the plurality of printed circuit boards 130 and is electrically connected to the signal GNDs 131 of the respective printed circuit boards 130.

Note that a plurality of notches may be formed in the metal bar 140 and the printed circuit boards 130 may be fitted in the notches, thereby connecting the metal bar 140 and the plurality of printed circuit boards 130. Alternatively, the metal bar 140 and the plurality of printed circuit boards 130 may be connected by other methods.

The dielectric 150 is a plate-like solid body having relatively high dielectric properties. The dielectric 150 is also called an insulator. For example, an epoxy resin, an acrylic resin, a silicone resin, a plastic resin, and glass are examples of the dielectric 150.

The dielectric 150, together with the metal bar 140 and (the metal-made bottom surface of) the card basket 110, constitutes a capacitor having specific frequency characteristics.

The capacitor constituted by the metal bar 140, the dielectric 150, and (the metal-made bottom surface of) the card basket 110 will be called a "noise control capacitor 159" hereinafter.

Depending on the positions of the signal GNDs 131 of the printed circuit boards 130, the noise control capacitor 159 may be placed at a portion (for example, on the metal-made top surface side of the card basket 110) other than the bottom surface side of the card basket 110, unless it hinders when constituting the electronic device 100.

Figure 2:
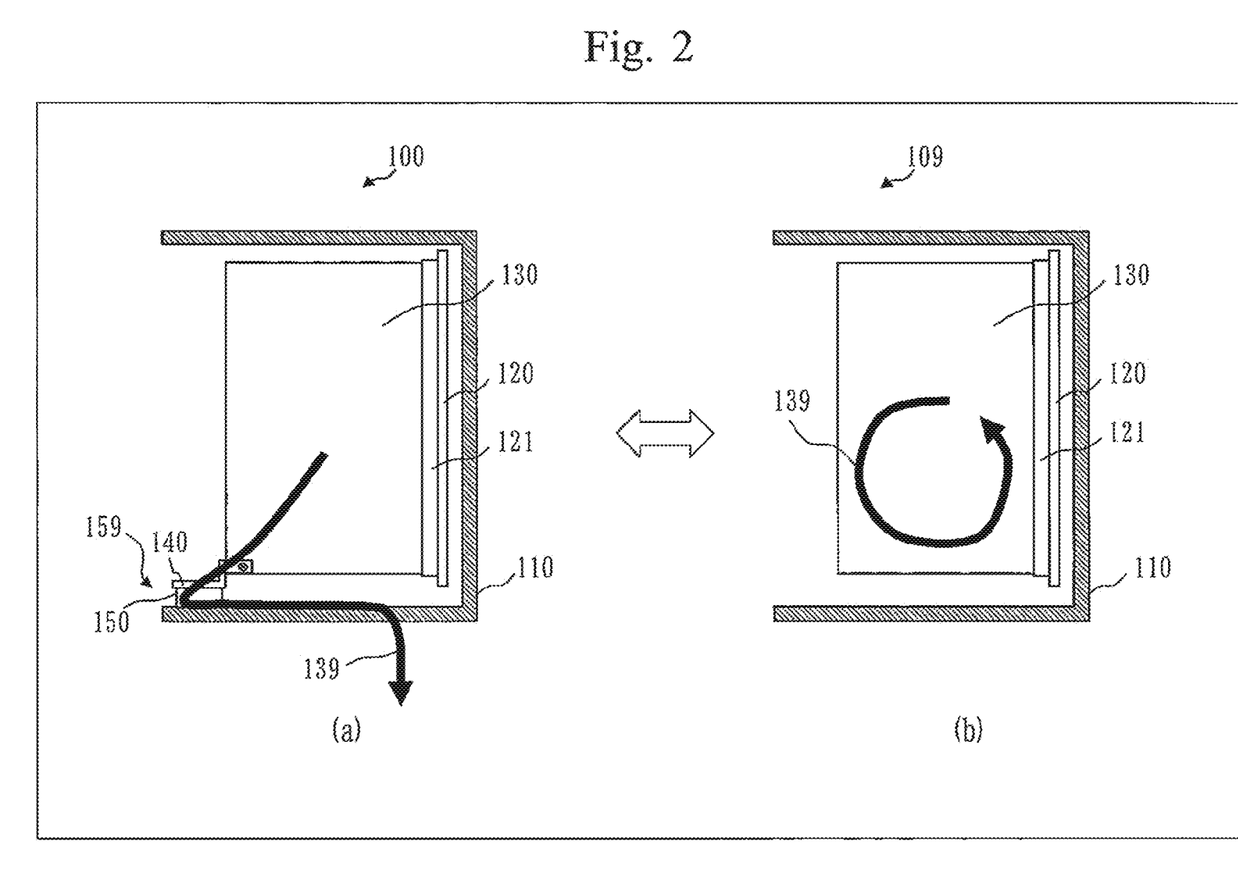
FIG. 2 illustrates the flow of electromagnetic noise 139 in the electronic device 100 according to Embodiment 1 and in a conventional electronic device 109.

FIG. 2 illustrates the flow of electromagnetic noise 139 in the electronic device 100 according to Embodiment 1 and in a conventional electronic device 109.

In FIG. 2, (a) illustrates the flow of the electromagnetic noise 139 in the electronic device 100 according to Embodiment 1, and (b) illustrates the flow of the electromagnetic noise 139 in the conventional electronic device 109.

Referring to (b) of FIG. 2, in the conventional electronic device 109, printed circuit boards 130 and a card basket 110 are insulated. Thus, the electromagnetic noise 139 (the same as the electromagnetic noise 139 occurring in the electronic circuit; the same applies hereinafter) occurring in a signal GND 131 of the printed circuit board 130 cannot be released to the card basket 110. Hence, the electromagnetic noise 139 flowing in the electronic circuit of the printed circuit board 130 increases, leading to a possibility that the electronic circuit of the printed circuit board 130 does not operate correctly.

On the other hand, the electronic device 100 according to Embodiment 1 illustrated in (a) of FIG. 2 is provided with the metal bar 140, the dielectric 150, and the card basket 110, thus constituting the noise control capacitor 159. Hence, the electromagnetic noise 139 occurring in the signal GND 131 of the printed circuit board 130 can be released to the noise control capacitor 159, or to the outside (for example, the ground) of the card basket 110 via the noise control capacitor 159. As a result, the electronic circuit of the printed circuit board 130 operates stably.

Usually, high-frequency electromagnetic noise 139 (also called high-frequency noise or electromagnetic radiation noise) tends to occur in the signal GND 131 of the printed circuit board 130.

On the other hand, the capacitor (including the noise control capacitor 159) has frequency characteristics that a low-frequency AC current does not flow through it easily while a high-frequency AC current tends to flow through it easily.

Hence, the noise control capacitor 159 can cause the high-frequency (for example, 30 MHz or more) electromagnetic noise occurring in the signal GND 131 of the printed circuit board 130 to flow to the outside of the card basket 110 (see (a) of FIG. 2).

Electromagnetic noise such as lightning surge occurring outside often has a low frequency (for example, 1 MHz or less).

In this case, the noise control capacitor 159 shields the low-frequency electromagnetic noise (also called low-frequency noise or external noise) occurring outside so that the electromagnetic noise will not flow to the electronic circuit of the printed circuit board 130.

When high-frequency electromagnetic noise occurs outside and flows to the card basket 110 from the outside, the electromagnetic noise may undesirably flow to the electronic circuit of the printed circuit board 130 via the noise control capacitor 159. As the noise control capacitor 159 releases the high-frequency electromagnetic noise to the outside, however, the high-frequency electromagnetic noise flowing from the outside will not stay in the electronic circuit of the printed circuit board 130.

As described above, the noise control capacitor 159 can decrease the electromagnetic noise 139 in the electronic circuit of the printed circuit board 130 and enhance the durability of the printed circuit board 130 against external noise.

The capacitance of the noise control capacitor 159 can be adjusted by changing the size of the flat surface (the flat surface where the dielectric 150 is to be placed) of the metal bar 140, that is, the length, width, or area of the metal bar 140.

The capacitance of the noise control capacitor 159 can be adjusted also by changing the gap (that is, the thickness of the dielectric 150) between the metal bar 140 and the card basket 110, the material of the dielectric 150, and so on.

The frequency characteristics of the noise control capacitor 159 can be adjusted by changing, for example, the capacitance of the noise control capacitor 159.

For example, where the size of the metal bar 140 is 300 mm×10 mm (mm: millimeter), the gap between the metal bar 140 and the card basket 110 is 1 mm, and the dielectric 150 is made of an epoxy resin having a dielectric constant of 4.0, the capacitance of the noise control capacitor 159 is approximately 100 pF (picofarad).

Figure 3:
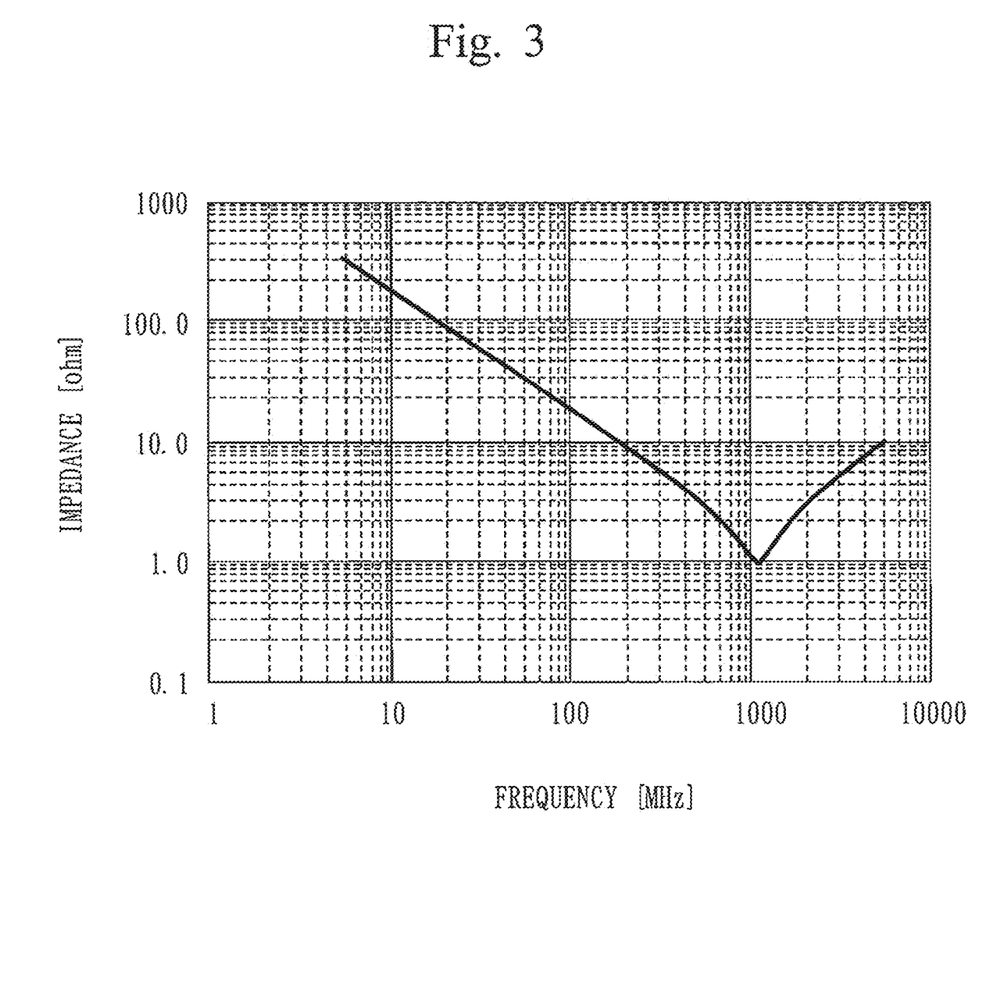
FIG. 3 is a graph illustrating an example of the frequency characteristics of a noise control capacitor 159 according to Embodiment 1.

FIG. 3 is a graph illustrating an example of the frequency characteristics of the noise control capacitor 159 according to Embodiment 1. In FIG. 3, the axis of ordinate represents the impedance, and the axis of abscissa represents the frequency.

For example, the noise control capacitor 159 with 100 pF has frequency characteristics as illustrated in FIG. 3.

More specifically, with this noise control capacitor 159, if the frequency of the electromagnetic noise (AC current) is low, the impedance is large. As the frequency of the electromagnetic noise increases, the impedance decreases. Where the frequency of the electromagnetic noise exceeds approximately 1,000 Hz, as the frequency of the electromagnetic noise increases, the impedance of the noise control capacitor 159 increases.

The noise control capacitor 159 having such frequency characteristics can release high-frequency electromagnetic noise of a specific frequency band (for example, about 30 MHz to 1,000 Hz) and shield low-frequency (for example, 10 MHz or less) electromagnetic noise.

As described above, by changing the length of the metal bar 140, the width of the metal bar 140, the material of the dielectric 150, and so on, the noise control capacitor 159 can be constituted to match the frequency of the electromagnetic noise that should be released from the signal GND 131 to the frame GND (card basket 110).

In Embodiment 1, for example, the electronic device 100 and an electromagnetic noise control method as follows have been explained.

The plurality of printed circuit boards 130 are mounted in the card basket 110 such that they are arranged in parallel to each other. The signal GNDs 131 of the respective printed circuit boards 130 are electrically connected to each other via the metal bar 140.

The dielectric 150 is interposed between the metal bar 140 and the card basket 110. The metal bar 140, the dielectric 150, and the card basket 110 constitute the noise control capacitor 159.

The noise control capacitor 159 releases, from the card basket 110 to the ground, the high-frequency electromagnetic noise occurring in the signal GNDs 131 of the printed circuit boards 130 and the high-frequency electromagnetic noise flowing from the outside, and shields the low-frequency electromagnetic noise occurring outside.

Thus, the electromagnetic noise in the electronic circuits of the printed circuit boards 130 decreases, and the durability of the printed circuit boards 130 against the external noise is enhanced, so that the electronic circuits of the printed circuit boards 130 operate stably.

The signal GNDs 131 of the respective printed circuit boards 130 are connected to each other via the metal bar 140 which is larger in size and lower in impedance than the connector pins, instead of small-size, large-impedance connector pins (the electrical connecting portions of the connectors 121). Therefore, the potential difference among the signal GNDs 131 decreases, and the electronic circuits of the printed circuit boards 130 tend to operate stably.

Furthermore, conformity with the international standard CIRPR publ. 11 (radiation field), the international standard IEC 61000-4-2 (electrostatic immunity), and other noise immunity standards, which was conventionally difficult to achieve, is achieved easily.

Figure 4:
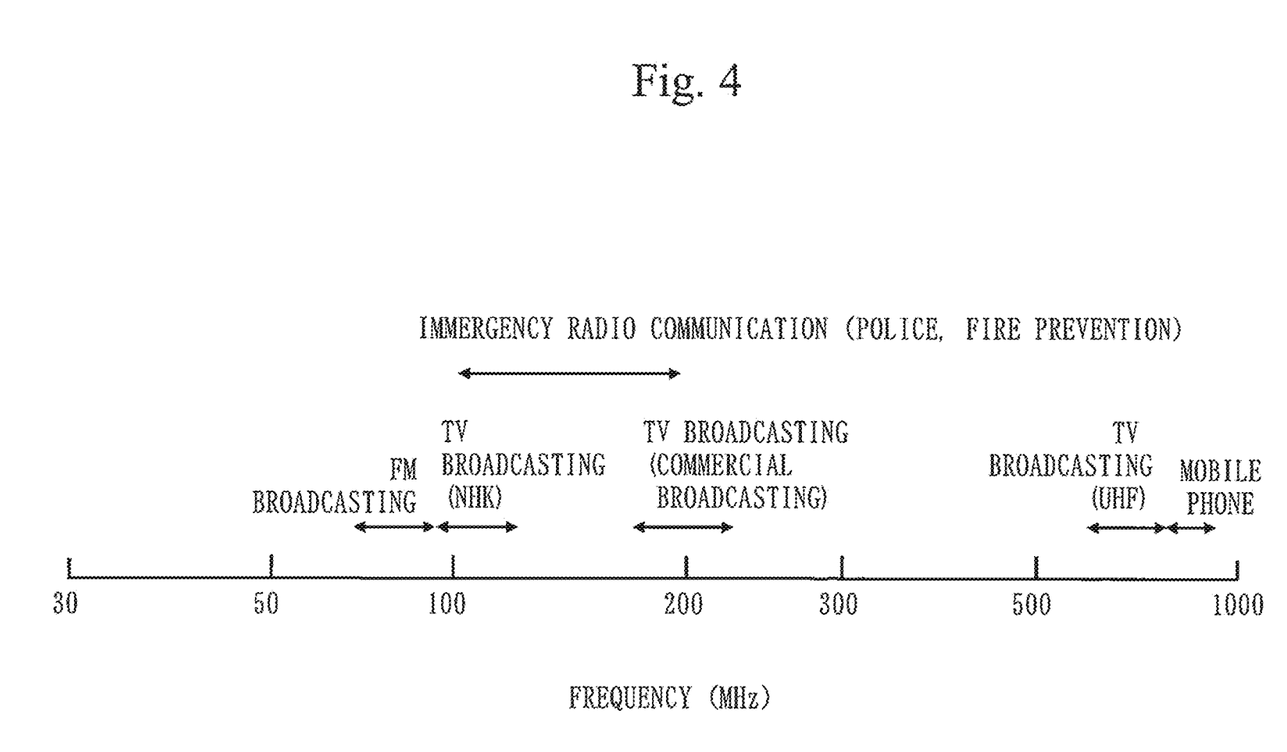
FIG. 4 is a graph illustrating the frequency range employed in broadcasting or communication.

FIG. 4 is a graph illustrating the frequency range utilized in broadcasting or communication.

The international standard CIRPR publ. 11 (radiation field) is a standard for regulating the intensity of the electromagnetic wave (for example, the electromagnetic wave of the frequency band illustrated in FIG. 4) which propagates in the air from an electronic device during the operation of the electronic device and influences a television, a communication device, or the like. The intensity of this electromagnetic wave is also called disturbing wave field strength.

The international standard IEC 61000-4-2 (electrostatic immunity) is a standard related to the durability of an electronic device against a voltage occurring when the static electricity charged on the human body is discharged.

Embodiment 2

An embodiment in which the effect of Embodiment 1 is enhanced will be described.

Description will now be made mainly on matters that are different from Embodiment 1. Matters that are not described are the same as their counterparts in Embodiment 1.

Figure 5:
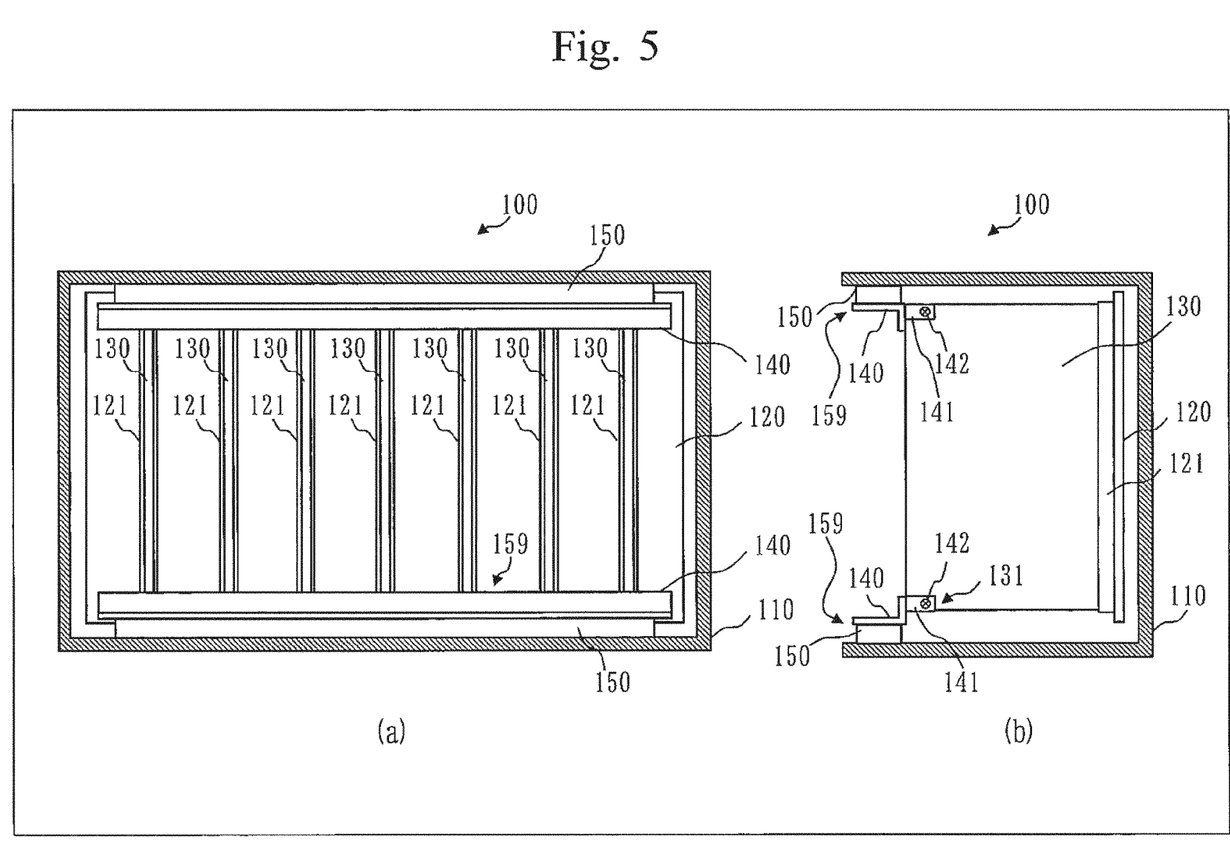
FIG. 5 illustrates the internal structure of an electronic device 100 according to Embodiment 2.

FIG. 5 illustrates the internal structure of the electronic device 100 according to Embodiment 2. In FIG. 5, (a) is a front view, and (b) is a side sectional view.

The electronic device 100 according to Embodiment 2 will be described with reference to FIG. 5.

The electronic device 100 is provided with a metal bar 140 and a dielectric 150 not only on the bottom surface side (the lower side of printed circuit boards 130) of a card basket 110 but also on the top surface side (the upper side of the printed circuit boards 130) of the card basket 110.

More specifically, the electronic device 100 has a plurality of noise control capacitors 159 each constituted by the metal bar 140, the dielectric 150, and (the metal surface of) the card basket 110. In other words, the electronic device 100 has a plurality of noise control capacitors 159 connected in parallel to each other.

Depending on the positions of signal GNDs 131 of the printed circuit boards 130, the noise control capacitor 159 may be placed at a portion other than the upper side or lower side of the printed circuit boards 130, unless it hinders when constituting the electronic device 100. Also, three or more noise control capacitors 159 may be provided.

With the plurality of noise control capacitors 159, the electromagnetic noise 139 occurring in the electronic circuits of the printed circuit boards 130 can be easily released to the outside via the noise control capacitors 159. Hence, the effect of decreasing the electromagnetic noise 139 in the electronic circuits of the printed circuit boards 130 as well as enhancing the durability of the printed circuit boards 130 against the external noise can be improved.

Also, with the plurality of noise control capacitors 159, the capacitance of the plurality of noise control capacitors 159 as a whole can be increased easily. As a result, a noise control capacitor having desired frequency characteristics can be constituted easily using the plurality of noise control capacitors 159 as a whole.

Embodiment 3

An embodiment will be described in which the signal GNDs 131 and the metal bar 140 are electrically connected to each other by carrying out a simple work.

Description will now be made mainly on matters that are different from Embodiment 1. Matters that are not described are the same as their counterparts in Embodiment 1.

Figure 6:
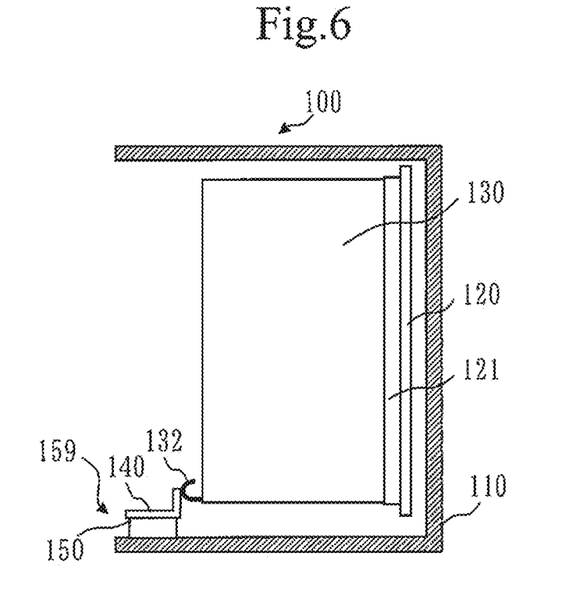
FIG. 6 is a side sectional view illustrating the internal structure of an electronic device 100 according to Embodiment 3.

FIG. 6 is a side sectional view illustrating the internal structure of an electronic device 100 according to Embodiment 3.

The electronic device 100 according to Embodiment 3 will be described with reference to FIG. 6.

Each printed circuit board 130 is provided with a J-shaped spring metal 132 which electrically connects a signal GND 131 and a metal bar 140 to each other. For example, the spring metal 132 is a plate spring.

The spring metal 132 may have a shape other than J shape (for example, U shape or L shape), or may be a spring (for example, a coil spring) other than a plate spring.

The spring metal 132 is urged by the elastic force of the spring to come into tight contact with the metal bar 140, to make the signal GND 131 and the metal bar 140 to electrically connect to each other.

Using the spring metal 132, the signal GND 131 of the printed circuit board 130 and the metal bar 140 can be electrically connected to each other by a work that is simpler than screw clamping the printed circuit board 130 and the metal bar 140 to each other as in Embodiment 1 (see FIG. 1).

Embodiment 4

An embodiment that facilitates constituting a noise control capacitor having desired frequency characteristics will be described.

Description will now be made mainly on matters that are different from Embodiment 1. Matters that are not described are the same as their counterparts in Embodiment 1.

Figure 7:
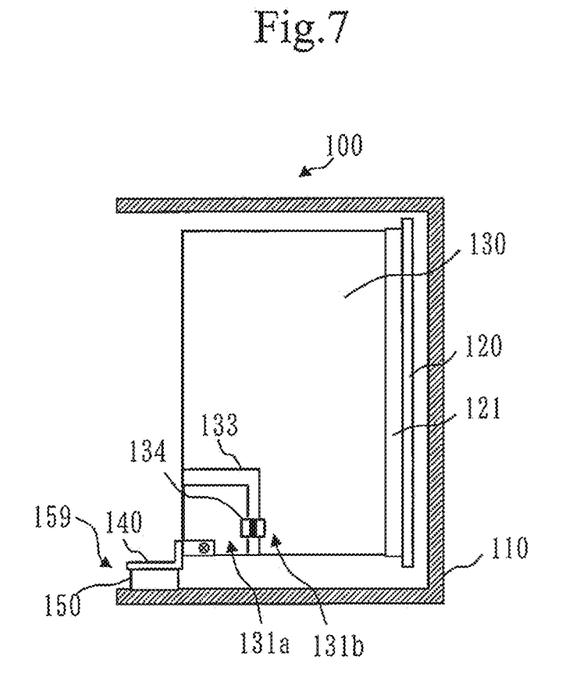
FIG. 7 is a side sectional view illustrating the internal structure of an electronic device 100 according to Embodiment 4.

FIG. 7 is a side sectional view illustrating the internal structure of an electronic device 100 according to Embodiment 4.

The electronic device 100 according to Embodiment 4 will be described with reference to FIG. 7.

Each printed circuit board 130 is provided with an insulating part 133 which divides a signal GND 131 into two parts, and an auxiliary capacitor 134 connected to extend across two signal GNDs 131a and 131b divided by the insulating part 133. One portion of the signal GND 131 which is connected to a metal bar 140 will be called the "signal GND 131a", and the other portion of the signal GND 131 will be called the "signal GND 131b".

More specifically, one electrode portion of the auxiliary capacitor 134 is connected to one signal GND 131a, and the other electrode portion of the auxiliary capacitor 134 is connected to the other signal GND 131b. Hence, the auxiliary capacitor 134 and a noise control capacitor 159 are connected in series.

For example, the auxiliary capacitor 134 is a chip-type capacitor. Alternatively, the auxiliary capacitor 134 may be a capacitor (for example, a lead-type capacitor) which is of a type other than the chip type.

The auxiliary capacitor 134 is employed to adjust the frequency characteristics of the noise control capacitor 159.

More specifically, the noise control capacitor 159 and the auxiliary capacitor 134 constitute one noise control capacitor having specific frequency characteristics.

To adjust the capacitance of the noise control capacitor 159, the size of the metal bar 140, the thickness or the material of a dielectric 150, and so on must be adjusted.

For this reason, it is sometimes difficult to constitute a noise control capacitor 159 having a capacitance that is necessary for obtaining desired frequency characteristics.

In that case, the noise control capacitor having the necessary capacitance can be constituted by combining the noise control capacitor 159 and the auxiliary capacitor 134.

In other words, the noise control capacitor having the desired frequency characteristics can be constituted by combining the noise control capacitor 159 and the auxiliary capacitor 134.

As a result, only electromagnetic noise of a specific frequency band can pass through.

Embodiment 5

An embodiment will be described in which the electromagnetic interference among printed circuit boards 130 is suppressed.

Description will now be made mainly on matters that are different from Embodiment 1. Matters that are not described are the same as their counterparts in Embodiment 1.

Figure 8:
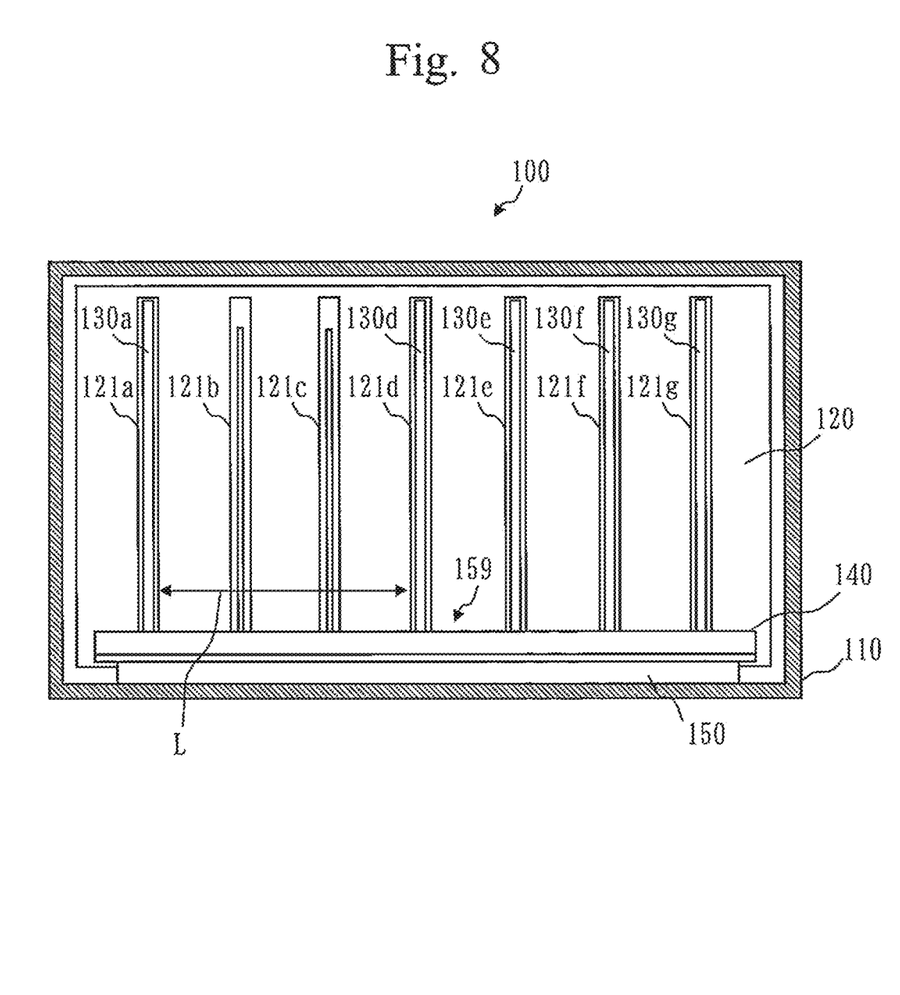
FIG. 8 is a front view illustrating the internal structure of an electronic device 100 according to Embodiment 5.

FIG. 8 is a front view illustrating the internal structure of an electronic device 100 according to Embodiment 5.

As illustrated in FIG. 8, by disposing the printed circuit boards 130a and 130d to be spaced apart by an electromagnetic interference suppression distance L, the electromagnetic interference occurring between the printed circuit boards 130a and 130d can be suppressed.

The electromagnetic interference suppression distance L is a design value determined in advance for suppressing the electromagnetic interference between the printed circuit boards 130a and 130d which are adjacent.

The electromagnetic interference suppression distance L may be provided not only between the printed circuit boards 130a and 130d but also between all the printed circuit boards 130a to 130g. Also, connectors 121b and 121c may be eliminated.

The respective embodiments may be combined partly or entirely as required within a non-contradictory range.

REFERENCE SIGNS LIST

100: electronic device; 109: electronic device; 110: card basket; 120: backboard; 121: connector; 130: printed circuit board; 131: signal GND; 132: spring metal; 133: insulating part; 134: auxiliary capacitor; 139: electromagnetic noise; 140: metal bar; 141: connecting portion; 142: screw; 150: dielectric; 159: noise control capacitor

The invention claimed is:

1. An electronic device comprising:
a plurality of circuit boards having signal grounds;
a conductive plate electrically connected to the signal grounds of the plurality of circuit boards;
a board housing frame that houses the plurality of circuit boards and the conductive plate and has a frame surface serving as a frame ground; and
a dielectric provided between the frame surface of the board housing frame and the conductive plate.

2. The electronic device according to claim 1, wherein the conductive plate, the dielectric, and the frame surface constitute a capacitor having specific frequency characteristics, the capacitor serving to release electromagnetic noise occurring in the signal grounds of the plurality of circuit boards to an outside of the board housing frame, the capacitor serving to shield external noise occurring outside of the board housing frame and having a frequency lower than a frequency of the electromagnetic noise.

3. The electronic device according to claim 1, comprising a plurality of metal springs which respectively electrically connect the signal grounds of the plurality of circuit boards to the conductive plate.

4. The electronic device according to claim 1, wherein the circuit board has, as the signal ground, a first signal ground, and furthermore has a second signal ground and a capacitor component, the capacitor component being connected to extend across the first signal ground and the second signal ground.

5. The electronic device according to claim 1, comprising:
a first conductive plate and a second conductive plate, as the conductive plate;
a frame having a first frame surface and a second frame surface, as the board housing frame, the first frame surface and the second frame surface serving as the frame surface; and
a first dielectric and a second dielectric, as the dielectric, the first dielectric being provided between the first conductive plate and the first frame surface, the second dielectric being provided between the second conductive plate and the second frame surface;
wherein the first conductive plate, the first dielectric, and the first frame surface constitute a first capacitor, and the second conductive plate, the second dielectric, and the second frame surface constitute a second capacitor, the first capacitor and the second capacitor serving as the capacitor.

6. The electronic device according to claim 1, wherein the plurality of circuit boards are arranged to be spaced apart from each other by not less than an electromagnetic interference suppression distance which is predetermined in advance in order to suppress electromagnetic interference.

7. The electronic device according to claim 1, wherein the circuit boards are arranged in parallel in a first direction and the conductive plate extends perpendicular to the first direction.

8. The electronic device according to claim 1, further comprising:
a backboard having a plurality of connectors to be connected to the plurality of circuit boards,
wherein the board housing frame houses the backboard with the plurality of circuit boards being connected to the plurality of connectors and the conductive plate being connected to the signal grounds of the plurality of circuit boards.

9. An electromagnetic noise control method comprising:
connecting a conductive plate to a signal ground of each of a plurality of circuit boards;
housing the plurality of circuit boards and the conductive plate, in a board housing frame having a frame surface serving as a frame ground; and
providing a dielectric between the frame surface and the conductive plate.

10. The electromagnetic noise control method according to claim 9, wherein the circuit boards are arranged in parallel in a first direction and the conductive plate is arranged to extend perpendicular to the first direction.

11. The electromagnetic noise control method according to claim 9, further comprising:
connecting the plurality of circuit boards to a plurality of connectors of a backboard; and
housing the plurality of circuit boards and the conductive plate, in the board housing frame by housing the backboard, in the board housing frame.

* * * * *